United States Patent
Louderback et al.

(10) Patent No.: US 7,412,170 B1
(45) Date of Patent: Aug. 12, 2008

(54) BROAD TEMPERATURE WDM TRANSMITTERS AND RECEIVERS FOR COARSE WAVELENGTH DIVISION MULTIPLEXED (CWDM) FIBER COMMUNICATION SYSTEMS

(75) Inventors: Duane A. Louderback, Zephyr Cove, NV (US); Peter Guilfoyle, Zephyr Cove, NV (US)

(73) Assignee: Opticomp Corporation, Zephyr Cove, NV (US)

( * ) Notice: Subject to any disclaimer, the term of this patent is extended or adjusted under 35 U.S.C. 154(b) by 431 days.

(21) Appl. No.: 10/852,842

(22) Filed: May 24, 2004

Related U.S. Application Data

(60) Provisional application No. 60/474,793, filed on May 29, 2003.

(51) Int. Cl.
*H04J 14/02* (2006.01)
*H04B 10/00* (2006.01)
*H04B 10/06* (2006.01)

(52) U.S. Cl. .................. 398/79; 398/158; 398/164; 398/202

(58) Field of Classification Search .................. 398/25, 398/9, 19, 33–34, 42–45, 79, 82, 140–141, 398/156, 158–159, 182, 192, 151, 153, 164, 398/202, 214, 90, 91, 171, 203, 204, 208, 398/15; 372/33–36, 38.02, 38.03
See application file for complete search history.

(56) References Cited

U.S. PATENT DOCUMENTS

| | | | |
|---|---|---|---|
| 4,667,300 A | 5/1987 | Guilfoyle | |
| 4,864,524 A | 9/1989 | Guilfoyle et al. | |
| 5,164,913 A | 11/1992 | Guilfoyle et al. | |
| 5,214,527 A * | 5/1993 | Chang et al. ................. | 398/202 |
| 5,267,183 A | 11/1993 | Guilfoyle et al. | |
| 5,297,068 A | 3/1994 | Guilfoyle et al. | |
| 5,347,525 A | 9/1994 | Faris | |
| 5,432,722 A | 7/1995 | Guilfoyle et al. | |
| 5,526,155 A | 6/1996 | Knox et al. | |
| 5,631,758 A | 5/1997 | Knox et al. | |
| 5,784,396 A * | 7/1998 | Guerin ..................... | 372/29.01 |

(Continued)

OTHER PUBLICATIONS

T. Tamir, et al., "Analysis and Design of Grating Couplers", Applied Physics, vol. 14, pp. 235-254, 1977.

(Continued)

*Primary Examiner*—M. R. Sedighian
(74) *Attorney, Agent, or Firm*—DLA Piper US LLP

(57) ABSTRACT

A wavelength division multiplexing (WDM) module for transmitting and/or receiving multiple signals simultaneously includes an array of vertical cavity surface emitting lasers (VCSELs) and/or photodetectors, respectively. In the transmitter case, different VCSELs are operated at different wavelengths that change depending on a value of a condition such as temperature and/or one or more other parameters. Multiple VCSELs are assigned to each channel of the WDM. The currently active VCSEL is switched to a different VCSEL assigned to a same channel and preferably having an operating wavelength that is closer to the signal wavelength at the current measured or estimated temperature and/or other parameter value. Multiple photodetectors are assigned to each channel of the WDM, and currently active detector is switched to the second detector within the same channel. A tuning layer and a resonant waveguide grating coupler are preferably integrated into the resonant structure of the VCSEL array and wavelength specific detector array.

24 Claims, 6 Drawing Sheets

U.S. PATENT DOCUMENTS

| | | | |
|---|---|---|---|
| 6,008,539 | A | 12/1999 | Shibata et al. |
| 6,057,562 | A | 5/2000 | Lee et al. |
| 6,078,064 | A | 6/2000 | Ming-Jiunn et al. |
| 6,121,127 | A | 9/2000 | Shibata et al. |
| 6,141,127 | A | 10/2000 | Boivin et al. |
| 6,148,016 | A | 11/2000 | Hegblom et al. |
| 6,204,512 | B1 | 3/2001 | Nakamura et al. |
| 6,501,773 | B1 * | 12/2002 | Volz et al. ............... 372/29.02 |
| 6,690,851 | B1 | 2/2004 | Guilfoyle |
| 6,757,499 | B1 * | 6/2004 | Aoki ............................ 398/182 |
| 7,031,608 | B2 * | 4/2006 | Chiaroni et al. ............... 398/79 |
| 2001/0035083 | A1 | 11/2001 | Fasanella et al. |
| 2002/0009258 | A1 * | 1/2002 | Coldren et al. ................ 385/24 |
| 2002/0067882 | A1 | 6/2002 | Guilfoyle |
| 2002/0097768 | A1 | 7/2002 | Thornton |
| 2004/0037513 | A1 | 2/2004 | Yap et al. |
| 2004/0161194 | A1 * | 8/2004 | Mittelstein et al. ............. 385/37 |
| 2005/0169327 | A1 * | 8/2005 | Eden et al. ............... 372/29.02 |

OTHER PUBLICATIONS

Hiroshi Nishihara, et al., Optical Integrated Circuits, McGraw-Hill, NY, 1985.

K. Tai, et al., "Drastic reduction of series resistance in doped semiconductor distributed Bragg reflectors for surface-emitting lasers," Appl. Phys. Lett., vol. 56, No. 25, pp. 2496-2498, Jun. 18, 1990.

P. Zhou, et al., "Low series resistance high-efficiency GaAs/AlGaAs vertical-cavity surface-emitting lasers with continuously graded mirrors grown by MOCVD," IEEE Photonics Technology Letters, vol. 3, No. 7, pp. 591-593, Jul. 1991.

B. Tell, et al., "Temperature dependence of GaAs-AlGaAs vertical cavity surface emitting lasers," Applied Physics Letters, vol. 60, pp. 683-685, Feb. 10, 1992.

M. Oberg, et al., "74 nm Wavelength Tuning Range of an InGaAsP/InP Vertical Grating Assisted Co-directional Coupler Laser with Rear Sampled Grating Reflector," IEEE Photonics Technology Letters, vol. 5, No. 7, pp. 735-738, Jul. 1993.

S.A. Chalmers, et al., "Low resistance wavelength-reproducible p-type (Al,Ga)As distributed Bragg reflectors grown by molecular beam epitaxy," Appl. Phys. Lett., vol. 62, No. 14, pp. 1585-1587, Apr. 5, 1993.

M.G. Peters, et al., "Band-gap engineered digital alloy interfaces for lower resistance vertical-cavity surface-emitting lasers," Appl. Phys. Lett., vol. 63, No. 25, pp. 3411-3413, Dec. 20, 1993.

B. Lu, et al, "High temperature pulsed and continuous-wave operation and thermally stable threshold characteristics of vertical-cavity surface-emitting lasers grown by metalorganic chemical vapor deposition," Appl. Phys. Lett., vol. 65, No. 11, pp. 1337-1339, Sep. 12, 1994.

Oliver Parriaux, et al., "Waveguide Coupling Gratings: Attractive Features and Dangerous Pitfalls", Guided-Wave Optoelectronics, edited by T. Tamir, G. Griffel, and H. Bertoni, Plenum Press, N.Y., pp. 333-354, 1995.

Ping Zhou, et al., "Vertical-cavity surface-emitting lasers with thermally stable electrical characteristics," J. Appl. Phys., vol. 77, No. 6, pp. 2264-2267, Mar. 15, 1995.

Ulrich Fiedler, et al., "Design of VCSEL's for Feedback Insensitive Data Transmission and External Active Cavity mode-Locking", IEEE Journal of Selected Topics in Quantum Electronics, vol. 1, No. 2, Jun. 1995.

T. Wipiejewski, et al., "Multiple wavelength vertical-cavity laser array employing molecular beam epitaxial regrowth," Electronics Letters, vol. 32, No. 4, pp. 340-342, Feb. 15, 1996.

Y. S. Lium, et al., "Polymer optical interconnect technology (POINT)- optoelectronic packaging and interconnect for board and backplane applications" Optoelectronic Interconnects and Packaging (eds. R. T. Chen and P.S. Guilfoyle), SPIE Optical Engineering Press, vol. CR62, pp. 405-414.

M.Y. Li, et al., "Top-emitting Micromechanical VCSEL with a 31.6-nm Tuning Range," IEEE Photonics Technology Letters, vol. 10, No. 1, pp. 18-20, Jan. 1998.

O. Sjolund, et al., "Monolithic Integration of Substrate Input/Output Resonant Photodetectors and Vertical-Cavity Lasers," IEEE Journal of Quantum Electronics, vol. 35, No. 7, pp. 1015-1023, Jul. 1999.

Carl Wilmsen, et al., Vertical Cavity Surface Emitting Lasers, 2nd edition (Cambridge Press), 1999.

D. A. Louderback, et al., "Modulation and Free-Space Link Characteristics of Monolithically Integrated Vertical-Cavity Lasers and Photodetectors with Microlenses"; IEEE Journal of Selected Topics in Quantum Electronics, vol. 5, No. 2, Mar./Apr. 1999.

J. Boucart, et al., "1-mW CW-RT Monolithic VCSEL at 1.55 μm", IEEE Photonics Technology Letters, vol. 11, No. 6, Jun. 1999.

Connie J. Chang-Hasnain, "Tunable VCSEL," IEEE Journal of Selected Topics in Quantum Electronics, vol. 6, No. 6, pp. 978-987, Nov./Dec. 2000.

P.G. Newman, et al, "Molecular beam epitaxial growth of vertical cavity surface emitting lasers with digital alloys and digital gradings," J. Vac. Sci. Technol. B, vol. 18, No. 3, pp. 1619-1622, May/Jun. 2000.

* cited by examiner

- Growth up to WDM tuning layer.
- Anodic etch of WDM tuning layer.

- Regrowth up to waveguide layer.
- Etch waveguide grating.

- Regrowth of remaining DBR.

# BROAD TEMPERATURE WDM TRANSMITTERS AND RECEIVERS FOR COARSE WAVELENGTH DIVISION MULTIPLEXED (CWDM) FIBER COMMUNICATION SYSTEMS

PRIORITY

This application claims the benefit of priority to U.S. provisional patent application No. 60/474,793, filed May 29, 2003, which is hereby incorporated by reference.

GOVERNMENT INTERESTS

The United States Government has a paid-up license in this invention and the right in limited circumstances to require the patent owner to license others on reasonable terms as provided for by the terms of Contract No. N68335-03-C-0091 awarded by the United States Naval Air Systems Command (NAVAIR).

BACKGROUND

1. Field of the Invention

The invention relates to wavelength division multiplexing (WDM) receivers and transmitters, particularly having high wavelength stability over a broad temperature range for CWDM fiber communication systems and bi-directional data communication systems.

2. Description of the Related Art

Current optical communication systems employ semiconductor devices to both emit and detect light signals. Whether these signals are coupled into silica fibers or used in free-space optical networks, their stability is important to increased system performance, when wavelength multiplexing is employed. One of the main sources of instability in semiconductor devices is temperature fluctuation. For example, semiconductor lasers used as light emitters have temperature sensitive emission wavelengths. Changes in wavelength as a function of temperature become a serious problem as multiple signals, each with a different wavelength, are fed simultaneously into an optical fiber as in Dense Wavelength Division Multiplexing (DWDM) and in Coarse Wavelength Division Multiplexing (CWDM) systems. To address this problem, many WDM systems employ thermoelectric coolers (TECs) to maintain a constant operating temperature. While this solution is effective, it is most often used in high-dollar applications where the semiconductor laser represents a small cost in the overall optical communication systems. Where cost is a major motivation, as in Fiber-To-The-Home (FTTH) applications, tunable laser sources and a variety of tunable vertical-cavity, surface-emitting lasers (VCSELs) provide a more affordable solution. However, these alternatives are problematic due to issues with device performance or complicated device fabrication, resulting in increased cost.

Thermoelectric Coolers

Thermoelectric coolers are solid-state heat pumps which operate on the Peltier effect. A schematic illustration of a commercially available TEC with two stages is shown in FIG. 1. In the Peltier effect, heat transfer occurs when electric current is passed through two dissimilar conductors. Thus, as a voltage is applied to two conductors a temperature difference is generated, which results in heat transfer from one material to another. Typically, a TEC consists of an array of p- and n-type semiconductor elements, packaged between two ceramic plates, that serve as the two conductors. As a bias is applied between the two materials, a decrease in temperature results in one material as it absorbs heat from the environment (for example, a semiconductor laser bonded to the TEC). The heat is carried away from the laser through the TEC by electron transport and released to a heat sink as the electrons move from a high-energy to a low-energy state. It follows that the heat pumping capacity of the TEC is proportional to the current and the number of elements within the ceramic package.

Currently, wavelength division multiplexed (DWDM and CWDM) transmitter and receiver modules achieve tolerance to temperature changes utilizing thermoelectric coolers (TEC) that control the temperature of the optoelectronic device, and therefore the wavelengths of the WDM channels. Stabilization of wavelengths in the optoelectronic components allows interconnect operation over a limited temperature range, but this comes at a price. TECs, their control electronics, and the packaging required to incorporate them, add significantly to the cost of WDM modules and complicate heat dissipation problem. In addition, TECs are sizeable resulting in large form-factors and bulky optical systems. As the temperature range that a TEC can maintain is limited, multiple stage TECs are required to achieve extended ranges. This addition however, adds significantly to the module's costs. Since each stage can maintain about a 30° C. temperature difference, a module with a temperature range exceeding 60° C. would require a three stage thermoelectric cooler.

A thermoelectric cooler requires a large amount of power to maintain a specified operating temperature for the optoelectronics. Power requirements scale with the number of stages, so maintaining temperatures over a broad range consumes a prohibitive amount of power for many applications. In addition, TECs have a slow response time, making them susceptible to problems in applications where temperatures change rapidly, as is the case for surveillance satellites in missile defense systems. Therefore, in applications where power, cost, heat removal or size is a limiting factor, TECs are not an ideal solution.

Tunable Lasers

Another possible solution to the temperature-induced instability in semiconductor lasers is the use of tunable semiconductor lasers. Using electronics, and a monitoring photodetector, a control circuit is used to maintain a constant wavelength laser output. Tunable sources come in several varieties including edge-emitting, distributed Bragg reflector (DBR) lasers, conventional VCSELs, and VCSELs with micromechanical mirrors. Although each of these tunable sources has been successfully fabricated, drawbacks exist. In some cases, tunable sources utilized in conjunction with TECs add complexity to an already expensive solution. Others have varying device performance over the tunable range, or have complicated and costly fabrication procedures. Each type of tunable laser will be described in the following sections.

Edge-Emitting Lasers

Edge-emitting lasers, as their name implies, emit light from the edge of the structure. These laser structures are conventionally used in many semiconductor laser applications. One type of edge emitting laser employs surface gratings, distributed over a large portion of the structure, to select the emission wavelength of the device. This type of edge emitting laser is referred to as a distributed Bragg reflector (DBR) laser. DBR lasers are fabricated in several ways, depending on desired device characteristics. For a large wavelength tuning range the laser is divided into several sections including a gain section, filter section, and grating section. Injecting current into different portions of the laser, such as the grating section, changes the refractive index of that portion. Thus, the emission wavelength is dependent on the current injected into the grating section. Using this configuration, and the InGaAsP/InP material system, a DBR laser is tunable over 74 nm in the 1550 nm wavelength range (see, e.g., M. Oberg, S. Nilsson, K. Streubel, J. Wallin, L. Backbom, and T. Kling a, "74 nm Wavelength Tuning Range of an InGaAsP/InP Vertical Grating Assisted Co-directional Coupler Laser with Rear Sampled Grating Reflector," IEEE Photonics Technology Letters, vol. 5, pp. 735-738, 1993, which is hereby incorporated by reference). While this tunability is highly desirable, device fabrication is very expensive due to the high cost of grating fabrication and five epitaxial growth steps. In addition, this DBR laser is used in conjunction with a TEC to achieve the desired device performance. Thus, for applications where cost is a motivating factor, this presents an undesirable option.

Vertical-Cavity Surface-Emitting Lasers

Unlike their edge-emitting counterparts, VCSELs emit light normal to the surface of the semiconductor wafer. This offers many important advantages, which explains the increased interest in VCSELs in both research and industry environments. FIG. 2 depicts a typical VCSEL structure. A VCSEL's structure includes a bottom, highly-reflective mirror consisting of alternating layers of high and low-index semiconductor materials, known as a DBR 2. The DBR 2 is shown on a GaAs substrate 4. Next, a semiconductor cavity, including n-contact layer 6, a second AlGaAs/GaAs DBR layer 8, a quantum well active region 10, a third AlGaAs/GaAs DBR layer 12, and a p-contact layer 14, is included. Finally, the structure is completed with a top, highly-reflective AlGaAs/GaAs DBR 16. The emission wavelength of the VCSEL is determined by several factors including cavity length, device current, and device temperature.

Typically, VCSELs are operated at a fixed current giving relatively stable output characteristics. By intentionally altering the temperature and/or the drive current, the wavelength of the device can be altered. Unfortunately, this method of tuning has serious drawbacks as VCSEL output power decreases with increasing temperature. FIG. 3 is typical of VCSEL device performance and illustrates the temperature dependence of output power. Four plots are shown for VCSEL output power as a function of drive current including for 10° C., 30° C., 50° C., and 70° C., representing a range of temperatures for a typical VCSEL. Emission wavelengths typically vary approximately 10 nm over a 200 degree change in temperature (see, e.g., B. Tell, K. F. Brown-Goebeler, R. E. Leibenguth, F. M. Baez, and Y. H. Lee, "Temperature Dependence of GaAs-AlGaAs Vertical Cavity Surface Emitting Lasers," Applied Physics Letters, vol. 60, pp. 683-685, 1992, which is hereby incorporated by reference). Unfortunately, the method of implementing temperature changes for VCSEL tuning requires multiple cascaded TECs whose disadvantages were previously discussed. Ultimately, the tunability range is quite small and results in poor performance.

VCSELs with Micromechanical Mirrors

The tunability of conventional VCSELs can be improved by altering design and fabrication processes. Employing a micromechanical (MEMS) mirror for one of the DBRs, the tunable range can be extended far past normal VCSEL operation (see, e.g., C. J. Chang-Hasnain, "Tunable VCSEL," IEEE Journal of Selected Topics in Quantum Electronics, vol. 6, pp. 978-987, 2000, which is hereby incorporated by reference). The principal behind this extended operation range is as follows. The MEMS mirror can be positioned by applying electrostatic forces through external bias sources. Slight movements of the mirror result in changes in cavity length, and alter the emission wavelength of the VCSEL.

FIG. 4 shows a schematic of a MEMS-based VCSEL including a top movable mirror 20. Note that the top mirror 16 of a typical VCSEL such as that illustrated at FIG. 2 is fixed. The system illustrated at FIG. 4 also includes a bottom mirror 22, on a substrate 23, and an active region 24, which correspond respectively to bottom mirror 2, substrate 4 and active region 10 of the VCSEL of FIG. 2. By applying an external bias ranging from 0 V to 26 V, a tunability over a 31.6 nm wavelength range was realized for a VCSEL with a movable mirror 20 such as that illustrated at FIG. 4 (see, e.g., M. Y. Li, W. Yuen, G. S. Li, and C. J. Chang-Hasnain, "Top-emitting Micromechanical VCSEL with a 31.6 nm Tuning Range," IEEE Photonics Technology Letters, vol. 10, pp. 18-20, 1998, which is hereby incorporated by reference). This tunability was accomplished while holding the device at room temperature. Unfortunately, the cost of obtaining this improved device performance is found in the more complicated fabrication process. The fabrication of moveable mirrors entails complicated processing steps involving undercut etching which enables movement of the top mirror 20. In addition, systems using MEMS-based VCSELs utilize additional hardware including mirror control circuitry and TECs in order to maintain constant device operation. Therefore this design, while an improvement over conventional VCSELs and costly edge-emitting lasers, still has cost and size disadvantages.

SUMMARY OF THE INVENTION

A wavelength division multiplexing (WDM) module for transmitting and/or receiving multiple signals simultaneously includes an array of vertical cavity surface emitting lasers (VCSELs) and/or photodetectors, respectively. In the transmitter case, different VCSELs are operated at different wavelengths that change depending on a value of a condition such as temperature and/or one or more other parameters. Multiple VCSELs are assigned to each channel of the WDM. When the wavelength of a currently active VCSEL varies a certain amount from the desired signal wavelength, the currently active VCSEL is switched to a different VCSEL preferably having an operating wavelength that is closer to the signal wavelength at that temperature and/or other parameter value. The temperature and/or other condition is/are determined, and preferably is/are measured, and a correspondence with the operating wavelengths of the active and inactive VCSELs is used (or the wavelength itself may alternatively be directly measured) in the determination whether to switch the active VCSEL, and if so to which currently inactive VCSEL. The transmitter array advantageously has at least one active VCSEL at each WDM channel aligned within the operating range of the module even when large changes in the temperature and/or other condition occurs. Advantageously, temperature control circuitry and thermoelectric coolers may be excluded from the design such that the temperature of the module may vary significantly, while the operating WDM wavelengths are maintained within desired ranges. A resonant cavity photodetector or other photodetector array may be configured in similar fashion as a receiver. A tuning layer and a resonant waveguide grating coupler are preferably integrated into the resonant structure of the VCSEL and/or photodetector array.

DETAILED DESCRIPTION OF THE PREFERRED EMBODIMENTS

Figure 1:
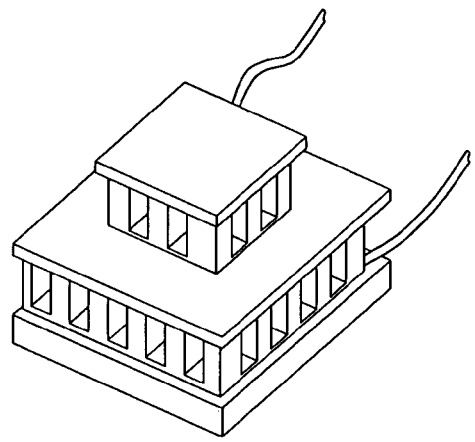
FIG. 1 schematically illustrates a commercially available TEC with two stages.
Figure 2:
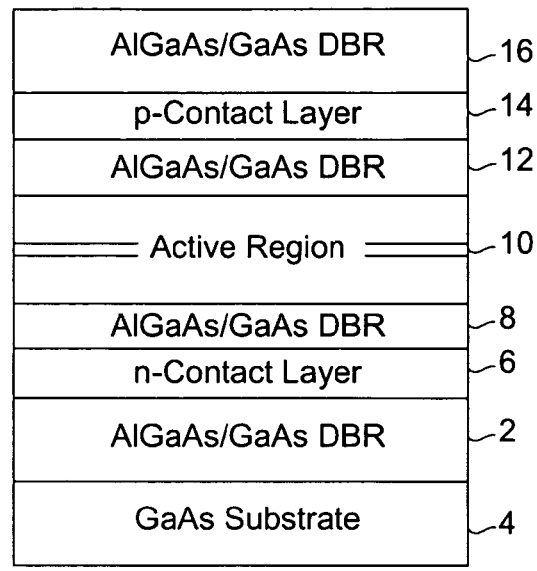
FIG. 2 schematically illustrates a typical VCSEL structure.
Figure 3:
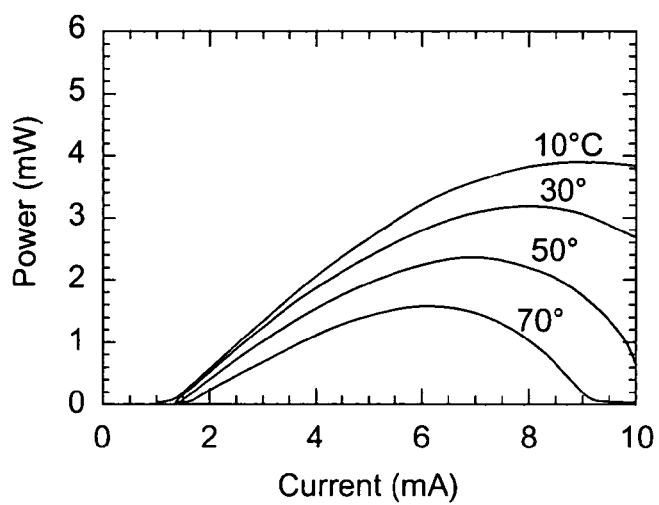
FIG. 3 shows several plots of output power as a function of drive current for several temperatures over a range of temperatures for a typical VCSEL.
Figure 4:
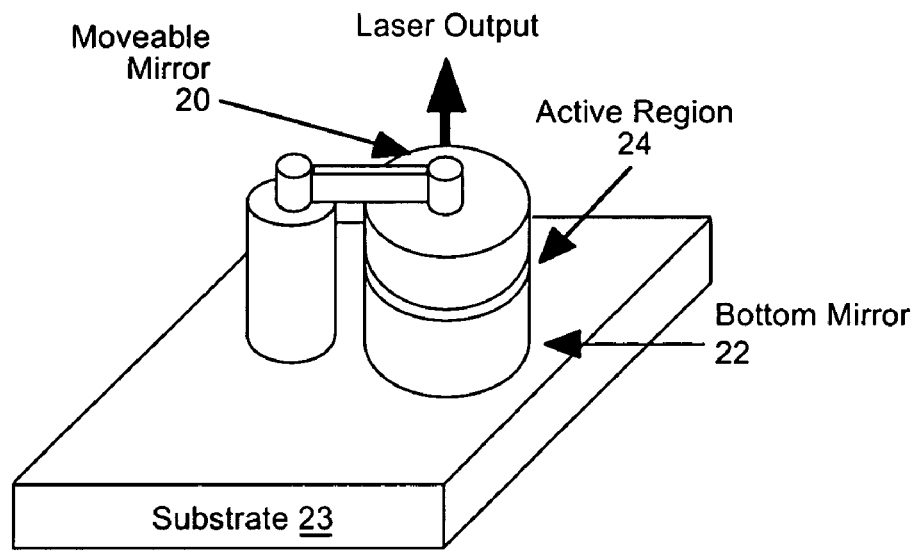
FIG. 4 schematically illustrates a MEMs-based VCSEL with a moveable top mirror.

The invention will now be illustrated in one or more preferred and alternative embodiments with reference to additional figures, and particularly FIGS. 5-10. A cite list of references is provided just below. Each reference is, in addition to those references cited above and below, and including that which is described as the invention summary and as background including FIGS. 14, hereby incorporated by reference into the detailed description of the preferred embodiments, as disclosing alternative embodiments of elements or features of the preferred embodiments not otherwise set forth in detail herein. A single one or a combination of two or more of these references and/or features may be consulted to obtain a variation of the preferred embodiments described in the detailed description. The references include:

M. Oberg, S. Nilsson, K. Streubel, J. Wallin, L. Backbom, and T. Kling a, "74 nm wavelength tuning range of an InGaAsP/InP vertical grating assisted codirectional coupler laser with rear sampled grating reflector," IEEE Photonics Technology Letters, vol. 5, pp. 735-738, 1993;

B. Tell, K. F. Brown-Goebeler, R. E. Leibenguth, F. M. Baez, and Y. H. Lee, "Temperature dependence of GaAs-AlGaAs vertical cavity surface emitting lasers," Applied Physics Letters, vol. 60, pp. 683-685, 1992;

C. J. Chang-Hasnain, "Tunable VCSEL," IEEE Journal of Selected Topics in Quantum Electronics, vol. 6, pp. 978-987, 2000;

M. Y. Li, W. Yuen, G. S. Li, and C. J. Chang-Hasnain, "Top-emitting micromechanical VCSEL with a 31.6 nm tuning range," IEEE Photonics Technology Letters, vol. 10, pp. 18-20, 1998;

O. Sjolund, D. A. Louderback, E. R. Hegblom, J. Ko, and L. A. Coldren, "Monolithic Integration of Substrate Input/Output Resonant Photodetectors and Vertical-Cavity Lasers," IEEE Journal of Quantum Electronics, vol. 35, pp. 1015-1023, 1999;

T. Wipiejewski, J. Ko, B. J. Thibeault, and L. A. Coldren, "Multiple wavelength vertical-cavity laser array employing molecular beam epitaxial regrowth," Electronics Letters, vol. 32, pp. 340-342, 1996;

Wilmsen, Temkin and Coldren, "Vertical Cavity Surface Emitting Lasers, 2nd edition (Cambridge Press);

Ulrich Fiedler and Karl Eberling, "Design of VCSEL's for Feedback Insensitive Data Transmission and External Active Cavity mode-Locking", IEEE JSTQE Vol. 1, NO. 2 (June 1995);

J. Boucart, et al., "1-mW CW-RT Monolithic VCSEL at 1.55 µm", IEEE Photonics Technology Letters, Vol. 11, No. 6 (June 1999);

D. A. Louderback, et. al., in "Modulation and Free-Space Link Characteristics of Monolithically Integrated Vertical-Cavity Lasers and Photodetectors with Microlenses"; IEEE Journal of Selected Topics in Quantum Electronics, Vol. 5, No. 2 (1999); and Y. S. Liu et. al. (1996) "Polymer optical interconnect technology (POINT): optoelectronic packaging and interconnect for board and backplane applications" Optoelectronic Interconnects and Packaging (eds. R. T. Chen and P. S. Guilfoyle), SPIE CR62: 405-414;

T. Tamir et al., "Analysis and Design of Grating Couplers", Applied Physics, vol. 14, pp. 235-254, 1997;

H. Nisihara, M. Haruna, T. Suhara, Optical Integrated Circuits, McGraw-Hill, NY, 1985;

M. G. Peters, B. J. Thibeault, D. B. Young, J. W. Scott, F. H. Peters, A. C. Gossard, and L. A. Coldren, "Band-gap engineered digital alloy interfaces for lower resistance vertical-cavity surface-emitting lasers," Appl. Phys. Lett., Vol. 63, no. 25, pp. 3411-3413, Dec. 20, 1993;

P. Zhou, B. Lu, J. Cheng, K. J. Malloy, S. Z. Sun, S. D. Hersee, and J. C. Zolper, "Vertical-cavity surface-emitting lasers with thermally stable electrical characteristics," J. Appl. Phys., Vol. 77, No. 6, pp. 2264-2267, Mar. 15, 1995;

B. Lu, P. Zhou, J. Cheng, K. J. Malloy, and J. C. Zolper, "High temperature pulsed and continuous-wave operation and thermally stable threshold characteristics of vertical-cavity surface-emitting lasers grown by metalorganic chemical vapor deposition," Appl. Phys. Lett., Vol. 65, No. 11, pp. 1337-1339, Sep. 12, 1994;

P. Zhou, J. Cheng, C. F. Schaus, S. Z. Sun, K. Zheng, E. Armour, C. Hains, W. Hsin, D. R. Myers, and G. A. Vawter, "Low series resistance high-efficiency GaAs/AlGaAs vertical-cavity surface-emitting lasers with continuously graded mirrors grown by MOCVD," IEEE Phot. Tech. Lett., Vol. 3, No. 7, pp. 591-593, July 1991.

K. Tai, L. Yang, Y. H. Wang, J. D. Wynn, and A. Y. Cho, "Drastic reduction of series resistance in doped semiconductor distributed Bragg reflectors for surface-emitting lasers," Appl. Phys. Lett., Vol. 56, No. 25, pp. 2496-2498, Jun. 18, 1990;

P. G. Newman, J. Pamulapati, H. Shen, M. Taysing-Lara, J. Liu, W. Chang, G. Simonis, B. Koley, M. Dagenais, S. Feld, and J. Loehr, "Molecular beam epitaxial growth of vertical cavity surface emitting lasers with digital alloys and digital gradings," J. Vac. Sci. Technol. B, Vol. 18, No. 3, pp. 1619-1622, May/June 2000;

S. A. Chalmers, K. L. Lear, and K. P. Killeen, "Low resistance wavelength-reproducible p-type (Al,Ga)As distributed Bragg reflectors grown by molecular beam epitaxy," Appl. Phys. Lett., Vol. 62, No. 14, pp. 1585-1587, Apr. 5, 1993;

O. Parriaux, V. Sychugov, A. Tishchenko, "Waveguide Coupling Gratings: Attractive Features and Dangerous Pitfalls", in Guided-Wave Optoelectronics, edited by T. Tamir, G. Griffel, and H. Bertoni, Plenum Press, N.Y., 1995, pp. 333-354; and United States published patent applications nos. 2002/0097768, 2001/0035083, 2002/0067882, and 2004/0037513; and U.S. Pat. Nos. 5,347,525, 5,526,155, 6,141,127, 5,347,525, 5,526,155, 6,141,127, 5,631,758, 6,008,539, 6,057,562, 6,204,512, 6,078,064, 5,164,913, 5,267,183, 5,297,068, 5,432,722, 4,864,524, 4,667,300, 6,148,016, 6,690,851, and 6,121,127 and 5,631,758; and U.S. patent applications Nos. 60/474,791, 60/474,793, 60/549,026, and 60/548,502.

Broad Temperature WDM Transmitters and Receivers

With the former description of tunable laser sources in mind, similar arguments can be made regarding the performance of photodetectors or receivers. Using the above mentioned solutions, large and costly modules can be developed. With the addition of multiple devices, running in parallel, a wavelength division multiplexing (WDM) system is advantageously implemented in accordance with a preferred embodiment by tuning the parallel devices to operate at different wavelengths. In order to couple lasers to detectors, a signal routing mechanism is used, such as preferably one or more fiber optic cables, to implement an optical network with a usable operating bandwidth. Conventional solutions would be costly, and when run in parallel to implement WDM channels, insertion loss and costs are further increased. Therefore, an alternative design with WDM capabilities, stable operation, a small form-factor, and low cost would be an attractive candidate for wide range of applications.

WDM Arrays of VCSELS and Photodetectors

Rather than stabilizing temperature to keep transmitters and receivers aligned, a method in accordance with a preferred embodiment utilizes an array of VCSELs and/or detectors where devices in the array operate at different wavelengths. These wavelengths are preferably evenly and closely spaced. As temperatures change, the wavelengths of the devices change, ensuring that one VCSEL or detector at each WDM channel is always aligned over the operating range of the module. Data is then transmitted through the VCSELs and detectors that are aligned at that particular temperature, while the other devices remain inactive. The wavelength spacing of the devices is preferably kept small, limiting component wavelength variation to an acceptable level. This acceptable range of wavelength variation can be as small as desired and is incorporated in the design specifications of the structure. The entire system is calibrated initially for a wide range of temperatures and the wavelength/temperature data is stored in memory.

In a preferred embodiment, data is directed to appropriate devices by a CMOS chip to which the optoelectronics are flip-chip bonded. A DSP (Digital Signal Processor) can be used for that purpose. The CMOS chip (or DSP) receives temperature data from a low cost thermistor and uses that information to determine which devices are properly aligned at that temperature. The data is then switched to the devices aligned at the correct wavelength. This data switching is performed in the CMOS at high speed and is transparent externally. For the sake of discussion, a wavelength of 1300 nm is used, though the idea is not limited to this wavelength, nor the fabrication method described.

Figure 5:
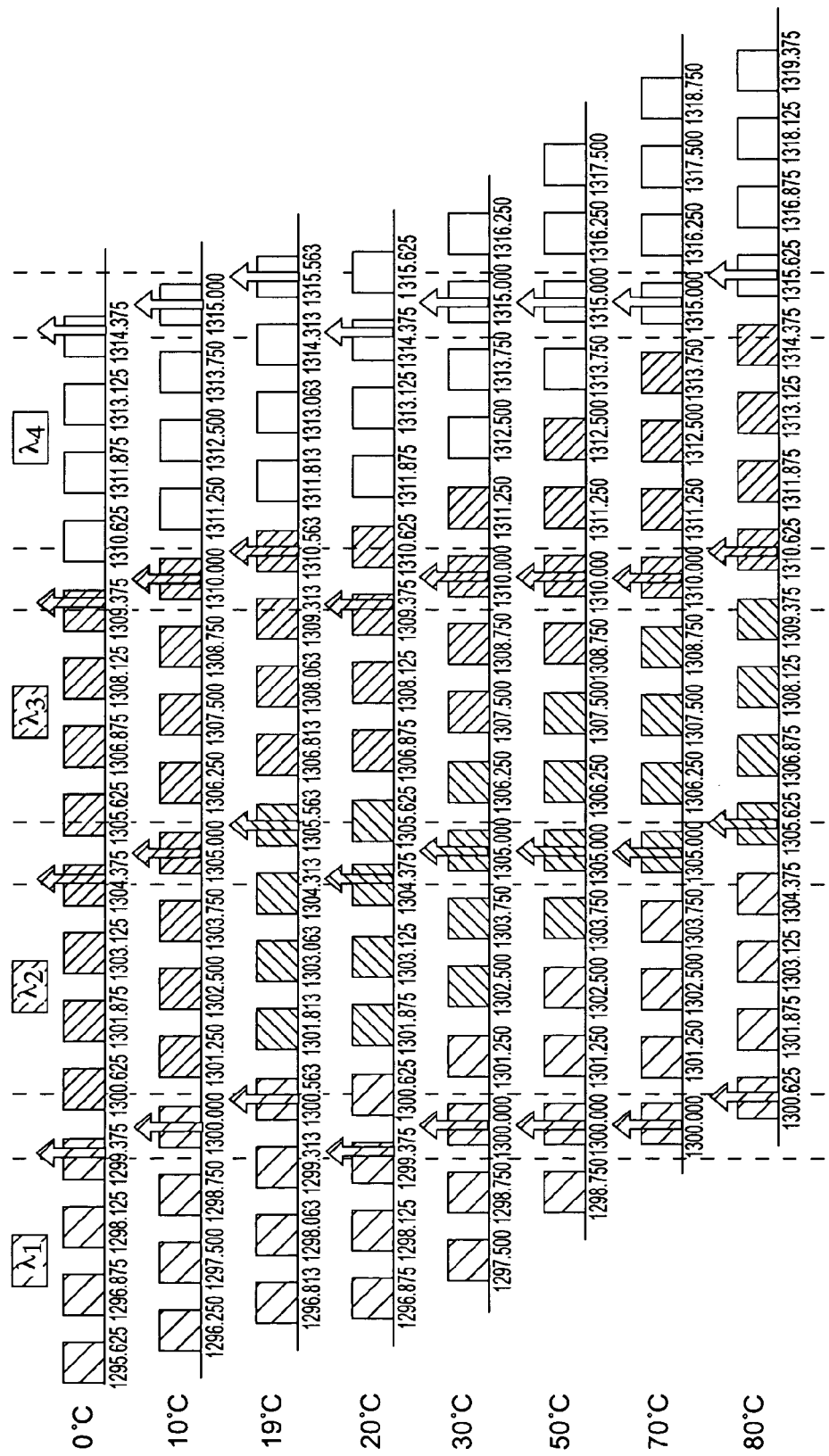
FIG. 5 schematically illustrates the operation of a broad temperature, four-wavelength WDM transmitter module at ~1300 nm.

FIG. 5 schematically illustrates the operation of a four channel (wavelength) WDM transmitter array. To illustrate how the temperature compensation works, FIG. 5 shows a module designed to operate over the temperature range of 0° C. to 80° C. Each WDM channel in the exemplary embodiment illustrated at FIG. 5 includes four VCSELs, each operating over a portion of the temperature range at which the wavelength is aligned. For instance, the first VCSEL may be used between 0° C. and 20° C., with an operational wavelength between 1299.375 nm and 1300.625 nm. Given a fixed number of devices, if eight VCSELs were used for temperature compensation for each WDM channel, both the temperature and wavelength ranges over which they operate would preferably be cut in half. In general, unless there is some specific temperature range or ranges within which greater accuracy is desired than others, the ranges over which the VCSELs are used are preferably evenly spaced. By merely increasing the number of VCSELs per channel, wavelength can be controlled as accurately as desired for a particular application. As the temperature increases, the wavelengths of the VCSELs increase as well, ensuring that at least one VCSEL is always within an acceptable wavelength range for the desired channel. The drive CMOS includes control circuitry to route the data to the correct VCSEL based preferably upon the ambient temperature.

FIG. 5 illustrates the operation of the module at eight different temperatures, showing how the wavelengths of the VCSELs shift with temperature (−0.06 nm/° C.). The dotted lines show the range over which the wavelength can vary for each WDM channel. FIG. 5 shows that as temperature increases, the wavelengths of the VCSELs increase. Over the first 20° C. (0° C. to 20° C.), the first VCSEL for each WDM channel is aligned and data is transmitted through it, while the other VCSELs remain inactive. Over the next 20° C. (20° C. to 40° C.), the second VCSEL for each channel is used. In this way, over the entire temperature range, there are always VCSELs available to transmit at the desired wavelengths. This advantageous method of temperature compensation utilizes free areas on a VCSEL chip to add redundant VCSELs for each channel. These redundant VCSELs, each at a different wavelength, cost very little, but can be used instead of conventional temperature control circuitry and/or a thermoelectric cooler. Receiver modules may be operated in the same way by utilizing the inherent wavelength shift that temperature induces on any semiconductor cavity.

Using a form of receiver called a resonant-cavity photodetector, the implementation of the system becomes somewhat simpler and less costly. A resonant-cavity photodetector comprises a structure very similar to a VCSEL. It includes a quantum well active region placed between two highly reflective mirrors. The response of a resonant-cavity photodetector is limited to a smaller wavelength range than conventional photodetectors due to the resonant cavity (see, e.g., O. Sjolund, D. A. Louderback, E. R. Hegblom, J. Ko, and L. A. Coldren, "Monolithic Integration of Substrate Input/Output Resonant Photodetectors and Vertical-Cavity Lasers," IEEE Journal of Quantum Electronics, vol. 35, pp. 1015-1023, 1999, which is hereby incorporated by reference). While certain photodetector applications would prefer a wide operating range, the implementation of the preferred embodiment works well using the resonant cavity device. The same epitaxy can be used for the fabrication of a VCSEL or a resonant cavity photodetector if properly designed. Thus, a matched photodetector can be grown at the same time as its corresponding transmitter. Since the detection range is limited in a resonant cavity detector, a parallel array of these devices can be fabricated that will be matched only to their respective transmitters and not to other VCSELs in the array.

Figure 6:
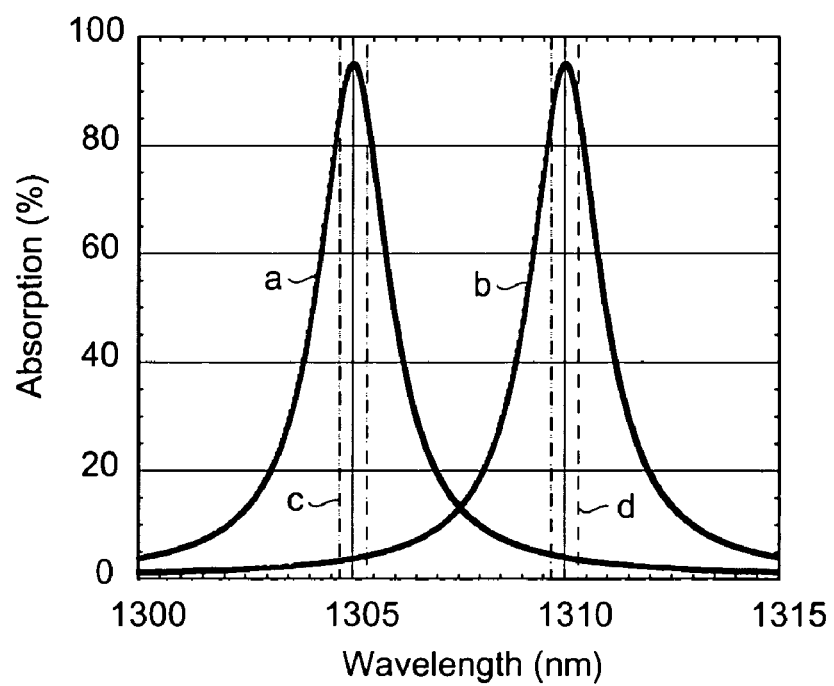
FIG. 6 includes plots of absorption versus wavelength illustrating the alignment of transmitted signals (gray area) with resonant cavity photodetectors over the operating temperature range of that particular set of devices.

FIG. 6 shows plots a and b of responses of two resonant cavity photodetectors centered at 1305 nm and 1310 nm, respectively, for adjacent WDM channels where the channel spacing is 5 nm. The widths of the wavelength ranges labeled c and d between pairs of dashed vertical lines in FIG. 6, also centered at 1305 nm and 1310 nm, respectively, correspond to illustrative temperature ranges over which the photoemission devices, e.g., VCSELs or edge-emitting lasers, operate. A transmitter module with 5 nm channel spacing and eight VCSELs per WDM channel may have the VCSELs partitioned into 0.625 nm operating ranges. In this example, there are eight VCSELs and detectors per WDM channel, thus breaking the entire temperature range into eight smaller temperature ranges over which any particular set of VCSELs and detectors would operate. The regions c and d between the pairs of dashed vertical lines in the plots indicate the ranges over which the VCSELs might align with the resonant cavity detectors. The dashed lines themselves indicate the boundaries for switching, or the worst case alignment for this particular configuration. As seen in FIG. 6, the response from the detectors changes very little with this small change in wavelength alignment. For the case shown, the signal level would drop by less than 0.5 dB from the perfectly aligned case and the crosstalk would increase by less than 1 dB.

In order to fabricate a WDM VCSEL/detector array, a method of controlling the wavelength is used. Coarse wavelength adjustments in resonant structures, such as VCSELs or resonant cavity photodetectors, involve the thickness of at least one layer being varied across the chip in a controlled manner. Accurate and repeatable thickness adjustments of a GaAs layer can be performed with anodic oxidation and etching. By adjusting the thickness of a tuning layer in the top DBR near the cavity and subsequently regrowing the rest of the epitaxial structure, the desired wavelength adjustments can be obtained (see, e.g., T. Wipiejewski, J. Ko, B. J. Thibeault, and L. A. Coldren, "Multiple Wavelength Vertical-Cavity Laser Array Employing Molecular Beam Epitaxial Regrowth," Electronics Letters, vol. 32, pp. 340-342, 1996, which is hereby incorporated by reference). This work also demonstrates that high quality regrowth on GaAs over these small etch depths is easily obtained. By using a binary etching technique, with each etch varying in depth by a factor of 2, 64 different etch depths can be obtained with only six etches. For a four wavelength WDM module with four temperature compensation ranges, four binary etch steps may be involved for realizing sixteen different wavelengths.

Figure 7:
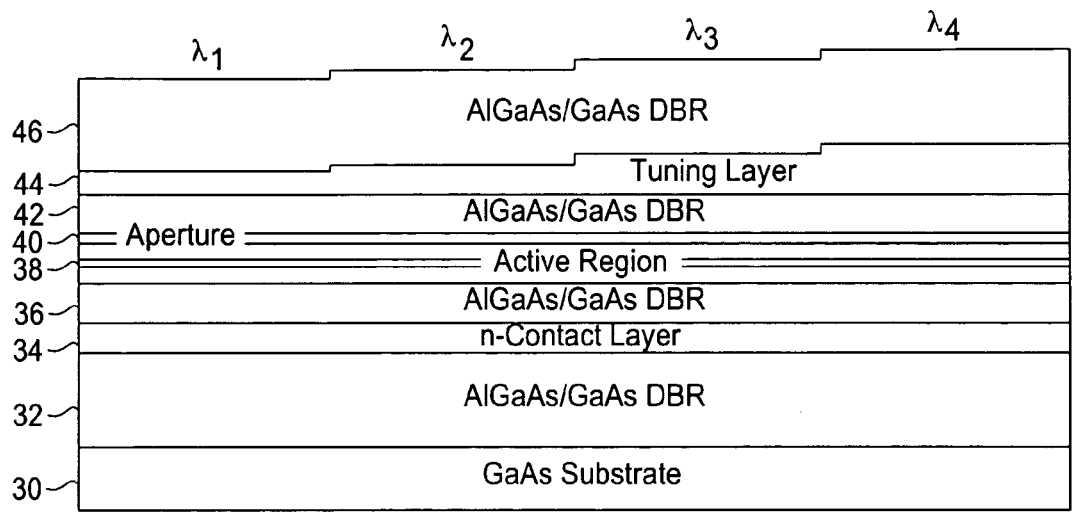
FIG. 7 schematically illustrates an epitaxial structure of a four-channel VCSEL array after etching of a tuning layer and regrowth of a top DBR structure.

FIG. 7 is a schematic of the structures used to realize a four-channel VCSEL array, preferably after the etching of a tuning layer 44 and regrowth of a top DBR structure 46. A GaAs substrate 30 is shown in FIG. 7 having an AlGaAs/GaAs DBR 32 formed thereon. A n-contact layer 34 is between the layer 32 and another AlGaAs/GaAs DBR layer 36. An active region 38 and aperture 40 are between the layer 36 and a further AlGaAs/GaAs DBR layer 42. Then, a tuning layer 44 is shown between layer 44 and a final AlGaAs/GaAs DBR 46. Four wavelength regions $\lambda_1$, $\lambda_2$, $\lambda_3$, and $\lambda_4$ are also illustrated in FIG. 7. The same or similar epitaxial material can be used to fabricate a wavelength-matched array of resonant cavity photodetectors.

Circuitry to Control Data Flow in Broad Temperature Array

Figure 8:
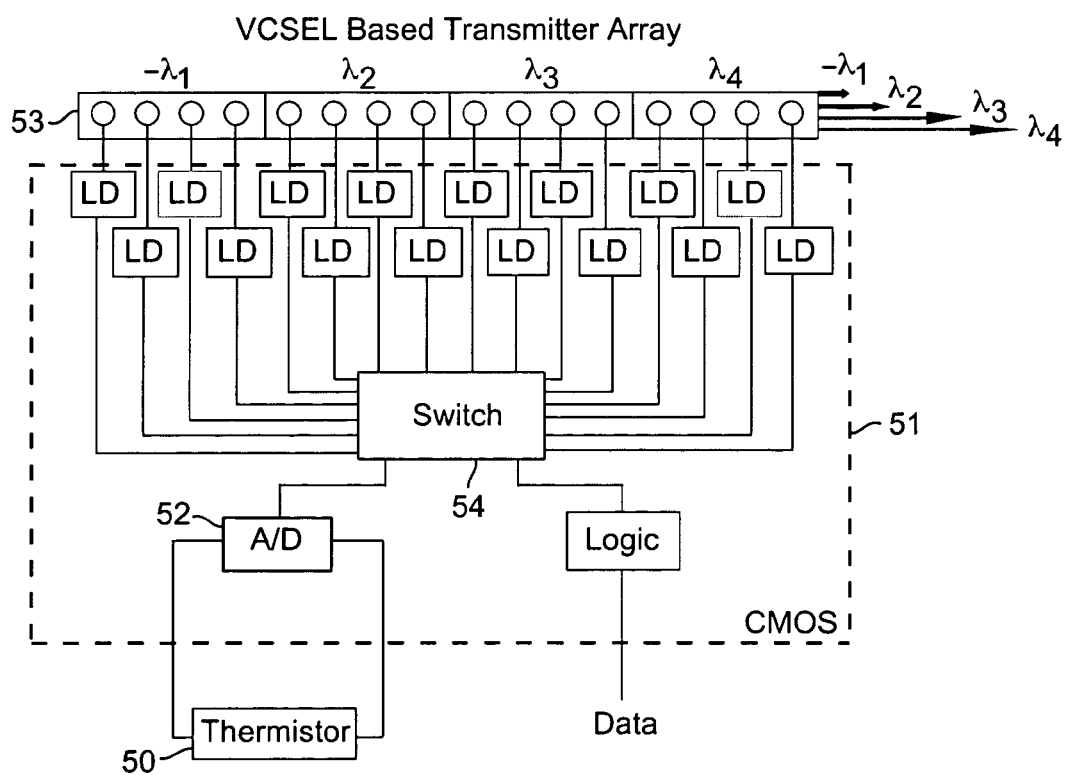
FIG. 8 schematically illustrates a control circuit for a broad temperature transmitter array showing data being directed through a switch to a correct VCSEL for each WDM wavelength at that temperature.

FIG. 8 shows a schematic of the control circuitry for a broad temperature, 4 channel transmitter module in accordance with a preferred embodiment. Among the components of the circuitry of FIG. 8, temperature data is preferably obtained directly from one or more small, low cost thermistors 50. Measuring the temperature is a preferred method for determining the temperature based upon which particular VCSELs and/or photodetectors are selected for use. Other techniques may be used to determine the temperature and/or to directly determine which VCSELs and/or photodetectors to use. For example, a learning algorithm, an expert system, a calculation rather than a measurement, a value pulled from a table based on a measured or calculated value of the temperature or a different parameter such as time, etc., may be used in alternative embodiments. Measuring and all of these techniques and others known to those skilled in the art are deemed to be techniques for "determining" a value of a "parameter" which may include temperature, time, etc., and/or simply which VCSELs and/or photodetectors to use.

The dotted line in FIG. 8 signifies the functions that are contained within a CMOS chip 51 on which a VCSEL-based transmitter array 53 is preferably flip-chip bonded. The module utilizes the thermistor 50 to sense the ambient temperature and relays this analog information to the CMOS 51. The analog temperature signal is sent through an analog-to-digital converter 52, so that it can be used to determine which temperature range the module is in, and hence, which VCSELs of the array 53 should be used for data transmission. This temperature range information is used by a switch 54 to direct the incoming data to the appropriate VCSELs of the array 53. The VCSELs that are not designated for that temperature range are left inactive. Depending on the requirements of the particular application, data may be switched between VCSELs in either packets or bits. These requirements will also determine whether VCSELs in adjacent temperature ranges are left biased so that they remain ready for data should the temperature move into their range. The functions of this circuitry can be implemented using a standard Digital Signal Processor chip. A data line 56 is connected to the switch 54 via logic 58 and to the transmitter array 53 for optically communicating the data coming in through the data line. The data would be incoming instead of outgoing for a photodetector array module, but the general receiver arrangement may be substantially the same as the transmitter illustrated at FIG. 8.

Implementation of the WDM Array Using Integrated Waveguides

Figure 9:
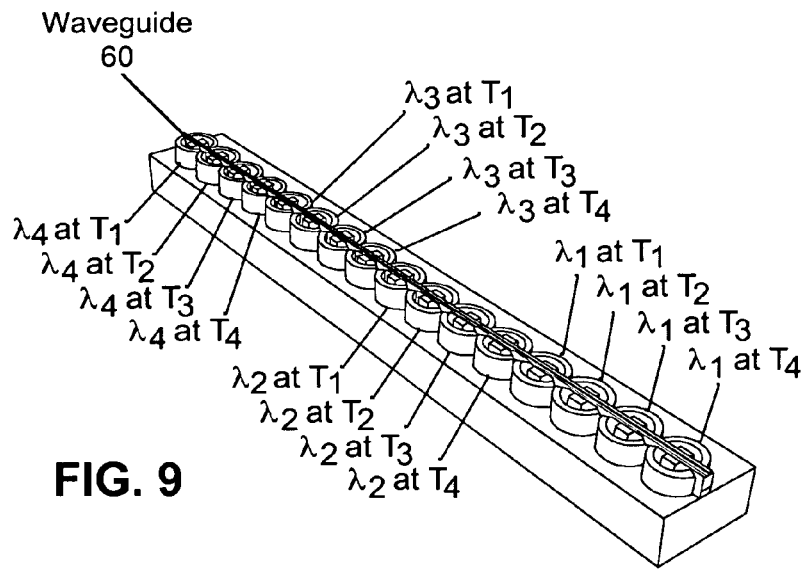
FIG. 9 schematically illustrates a four channel (wavelength) transmitter with four VCSELs for temperature compensation at each WDM wavelength.

While the previous discussion described a method for fabricating WDM arrays of VCSELs and resonant cavity photodetectors, a major challenge lies in interconnecting the transmitters or the receivers so that the signals can be coupled either out of (VCSEL) or into (detector) the system. Without an advantageous method of coupling light into/out of these arrays, costly packaging techniques for the system may be involved which could overwhelm the cost benefits of the described method. An advantageous procedure in accordance with a preferred embodiment for interconnecting these devices involves monolithic integration of a waveguide within the structure of the VCSELs and photodetectors. FIG. 9 is a schematic representation of an integrated waveguideNCSEL module in accordance with a preferred embodiment. In FIG. 9, the waveguide 60 is coupled to all of the VCSELs (labeled as $\lambda_i$ at $\lambda_j$, for i,j=1,2,3 and 4) of an exemplary sixteen VCSEL embodiment. The electronic circuitry illustrated at FIG. 8 preferably controls which of the lasers, for a given wavelength, will be used at a given temperature. Due to the structure of the resonant cavity photodetectors, the same schematic representation (FIG. 9) can be used to describe a series of detectors. Once again, the electronic circuitry of FIG. 8 preferably controls which of the detectors are active at a given temperature. The VCSELs of FIG. 9 are multiplexed into the waveguide preferably using resonant waveguide grating couplers.

Waveguide Grating Coupler

With VCSELs and resonant cavity photodetectors operating in the vertical direction, normal to the plane of the semiconductor substrate, a horizontal waveguide (i.e., in the plane of the substrate) is preferably used to interconnect the wavelength-matched transmitters and receivers. In order to couple vertical light horizontally into and out of the waveguide, a surface-normal grating can be employed to fabricate a waveguide grating coupler. These waveguide grating couplers are gratings etched into the surface of a waveguide that diffract vertically incident light horizontally, coupling it into the waveguide. This vertical-to-horizontal waveguide coupling allows all signal multiplexing/demultiplexing for a VCSEL/photodetector array to be done on chip. The performance of the grating coupler is dependent on its placement within the system. If the coupler is placed on the surface of the device, its coupling efficiency into the waveguide is relatively low. However, if the grating coupler is placed within the resonant structure in accordance with a preferred embodiment, the cavity resonance can be used to drastically improve the coupling efficiency. This is accomplished by placing the waveguide grating coupler on the peak of the standing wave, where the grating will interact with a much higher optical field intensity. The waveguide grating coupler can be designed having a different efficiency for VCSEL and detector arrays.

Figure 10A:
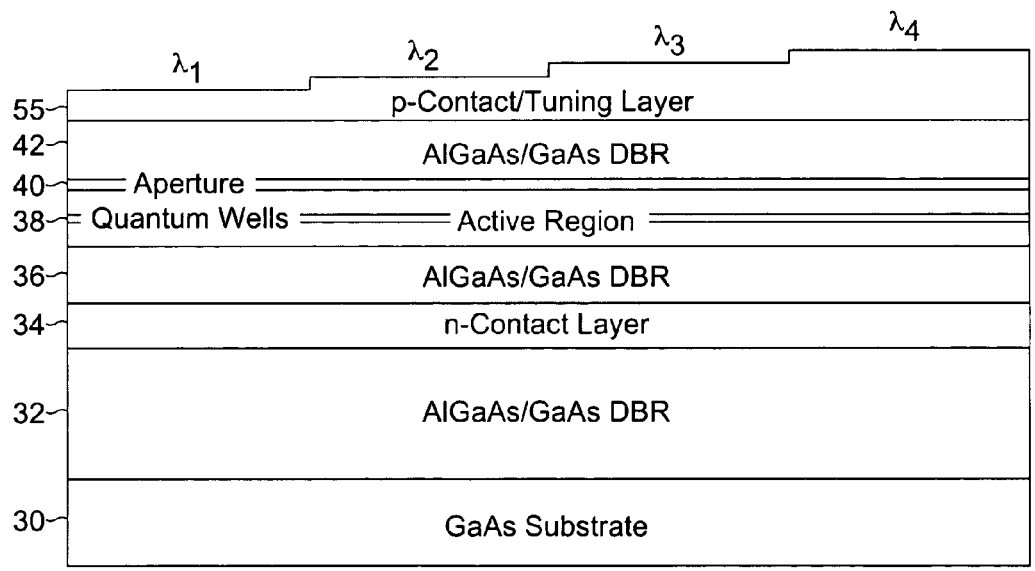
FIGS. 10a-10c schematically illustrate an epitaxial growth sequence for a monolithic WDM module.
Figure 10B:
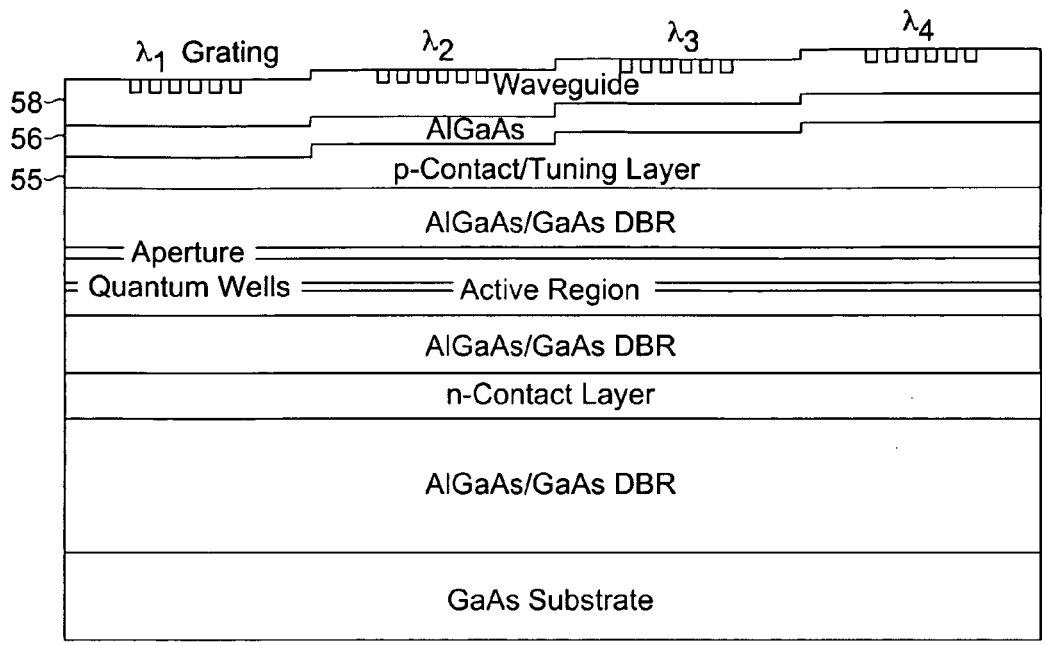
Figure 10C:
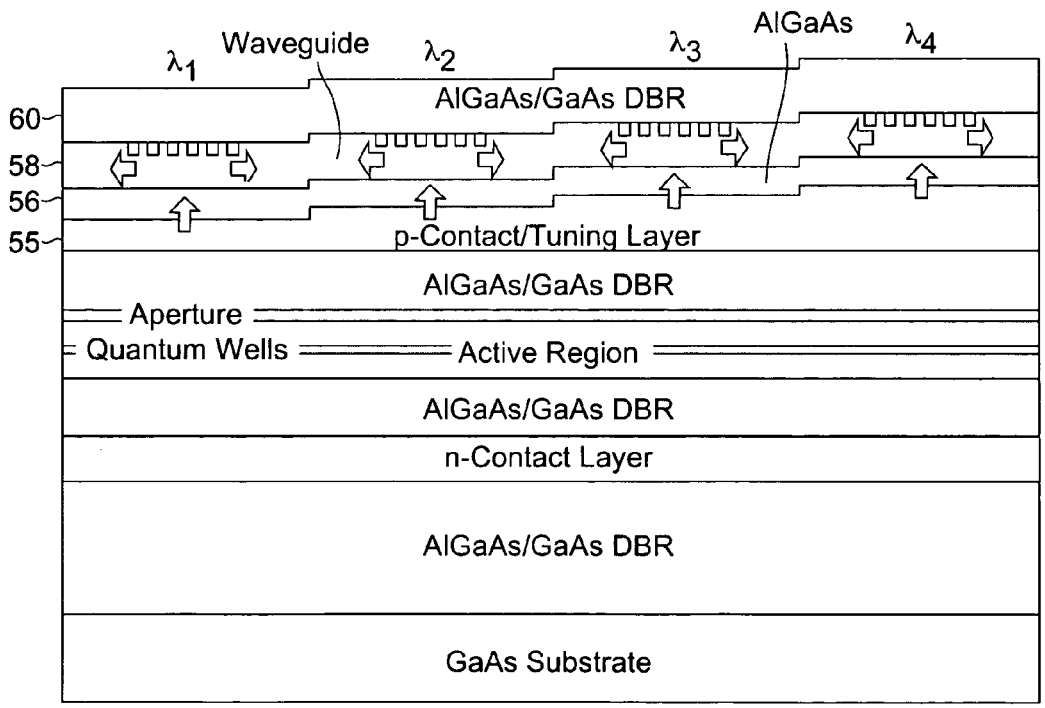

FIG. 10a shows a schematic of a four-channel WDM structure, utilizing a monolithic waveguide and grating coupler. The layers 30–42 were introduced previously with reference to FIG. 7. The tuning layer 55 was also introduced previously, but it was not mentioned then that the layer preferably undergoes an anodic etch and becomes a p-contact/tuning layer 55. FIG. 10b includes the structure of FIG. 10a, and further includes an AlGaAs layer 56 on the p-contact/tuning layer 55, as well as a waveguide layer 58 on the AlGaAs layer 56. Layer 58 is etched to form a waveguide grating layer 58. FIG. 10c includes the structure of FIG. 10b, and further includes a top AlGaAs/GaAs DBR 60.

The epitaxial structure will initially be grown up to the WDM tuning layer 55. After binary anodic etches are performed, the structure up to the waveguide layer 58 will be grown. At this point, the gratings of the waveguide layer 58 are patterned and etched. Finally, the remaining epitaxial layers 60 are grown.

The etch depths in the WDM tuning layer 55 and grating layer 58 have been greatly exaggerated for illustration. The actual etch depths involved will not generally pose a problem for either regrowth or the structure's operation. The waveguide layer 58, as well as the layers 56, 60 cladding it, are preferably undoped and will not introduce excessive losses from free carrier absorption. The regrowths also have a fairly large tolerance due to their positioning relatively far from the cavity.

Following epitaxial regrowth, device fabrication is preferably implemented including patterning, etching, and metallization. The preferred processes for VCSEL and resonant cavity photodetector fabrication are similar. The only difference involves an additional oxidation step used to create both a current-guiding aperture and a highly-reflective mirror in the VCSEL structure. The fabrication of the VCSEL structure starts with etching oxidation holes. These holes are etched in a circular pattern through the epitaxial structure. After the holes are etched, the aperture and part of the bottom DBR are oxidized for the VCSELs. For both the VCSEL and the detector, the remaining fabrication steps are identical: a series of three etches down to the waveguide layer, p contact layer, and n contact layer. The etch down to the waveguide layer defines the waveguide. Finally, the metal contacts are deposited.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention, as set forth in the claims and functional and structural equivalents thereof.

In addition, in methods that may be performed according to preferred embodiments herein and that may have been described above, the operations have been described in selected typographical sequences. However, the sequences have been selected and so ordered for typographical convenience and are not intended to imply any particular order for performing the operations.

What is claimed is:

1. A wavelength division multiplexing (WDM) module for receiving multiple signals simultaneously in CWDM or DWDM optical fiber communication system, comprising:
    an array of photodetectors including multiple photodetectors assigned to a single channel and having different ranges of operating wavelengths; and
    control electronics for switching a currently active photodetector to a second photodetector within the channel operating at a preferred wavelength compared to that of the active photodetector, wherein the switching is based on a determined value of a parameter of the WDM module.

2. The WDM module of claim 1, wherein the determined value comprises a measured value of said parameter of the WDM module.

3. The WDM module of claim 2, wherein the parameter comprises temperature.

4. The WDM module of claim 3, wherein thermal compensation is provided by adding redundant photodetectors for each channel, the redundant photodetectors operating at different wavelengths.

5. The WDM module of claim 1, wherein the control electronics comprise a switch configured to select an active photodetector based on an input signal.

6. The WDM module of claim 1, further comprising a waveguide and wavelength specific photodetector array multiplexed into the waveguide.

7. The WDM module of claim 6, further comprising a grating coupler providing optical coupling of the waveguide and detectors.

8. The WDM module of claim 1, further comprising a tuning layer within a resonant structure of the photodetector array.

9. The WDM module of claim 1, further comprising a digital signal processing (DSP) unit which allows calibration of wavelengths as a function of temperature, stores them in memory, and switches active wavelength specific detectors within specified boundaries of operating channels depending on the temperature.

10. A wavelength insensitive wavelength division multiplexing (WDM) module capable of transmitting and receiving multiple signals simultaneously in a CWDM or DWDM optical fiber bi-directional data communication system, comprising:

an array of vertical cavity surface emitting lasers (VCSELs) including multiple VCSELs assigned to a single channel and having different operating wavelengths; and control electronics for switching a currently active VCSEL to a second VCSEL within the channel operating at a preferred wavelength compared to that of the active VCSEL, wherein this switching is being based on a determined value of a parameter of the WDM module, an array of photodetectors including multiple photodetectors assigned to the same or a different single channel and having different ranges of operating wavelengths;

control electronics for switching a currently active photodetector to a second photodetector within the channel operating at a preferred wavelength range compared to that of the active photodetector, wherein the switching is being based on the same or a different determined value of the same or a different parameter of the WDM module.

11. The WDM module of claim 10, wherein the determined value or values comprise a measured value or measured values of said parameter or parameters of the WDM module.

12. The WDM module of claim 11, wherein the parameter or parameters comprise temperature.

13. The WDM module of claim 12, wherein thermal compensation is provided by adding redundant photodetectors, the redundant photodetectors operating at different wavelengths.

14. The WDM module of claim 12, wherein thermal compensation is provided by adding redundant VCSELs, the redundant VCSELs operating at different wavelengths.

15. The WDM module of claim 11, wherein the control electronics comprise a switch configured to select the active VCSEL based on an input signal.

16. The WDM module of claim 11, wherein the control electronics comprise a switch configured to select the active photodetector based on an input signal.

17. The WDM module of claim 16, wherein the same or a different switch of the control electronics is configured to select the active VCSEL based on an input signal.

18. The module of claim 11, further comprising a waveguide and wavelength specific
VCSEL array multiplexed into the waveguide.

19. The module of claim 18, further containing a grating coupler providing optical coupling of the VCSELs and the waveguide.

20. The module of claim 11, further comprising a waveguide and wavelength specific
photodetector array multiplexed into the waveguide.

21. The module of claim 20, further comprising a grating coupler providing optical coupling of the waveguide and detectors.

22. The module of claim 11, further comprising a tuning layer within the resonant structure of the VCSEL array.

23. The module of claim 11, further comprising a tuning layer within the resonant structure of the photodetector array.

24. The module of claim 11, further comprising a digital signal processing (DSP) unit which allows calibration of wavelengths as a function of temperature, stores them in memory, and switches active wavelength specific VCSELs and detectors within specified boundaries of operating channels depending on the temperature.

* * * * *